United States Patent
Terazawa et al.

(10) Patent No.: US 7,268,719 B2
(45) Date of Patent: Sep. 11, 2007

(54) ANALOGUE TO DIGITAL CONVERSION DEVICE OPERABLE ON DIFFERENT SAMPLING CLOCKS

(75) Inventors: Tomohito Terazawa, Gifu (JP); Takamoto Watanabe, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/402,894

(22) Filed: Apr. 13, 2006

(65) Prior Publication Data
US 2006/0244649 A1   Nov. 2, 2006

(30) Foreign Application Priority Data
Apr. 28, 2005   (JP)   ............................. 2005-132209

(51) Int. Cl.
*H03M 1/60* (2006.01)
(52) U.S. Cl. ....................... 341/157; 341/155; 341/166
(58) Field of Classification Search ................. 341/157
See application file for complete search history.

(56) References Cited

U.S. PATENT DOCUMENTS

| 5,396,247 A | * | 3/1995 | Watanabe et al. ............ 341/157 |
| 6,771,202 B2 | | 8/2004 | Watanabe et al. |
| 6,879,278 B2 | * | 4/2005 | Watanabe et al. ............ 341/155 |

FOREIGN PATENT DOCUMENTS

JP   2004-007385   1/2004

* cited by examiner

*Primary Examiner*—Rexford Barnie
*Assistant Examiner*—Khai M. Nguyen
(74) *Attorney, Agent, or Firm*—Posz Law Group, PLC (57) ABSTRACT

In an A/D conversion device, each delay unit in a pulse delay circuit has inverters INV of m×n stages (m, n are positive integers), a clock generator has m-delay lines, and each delay line has inverters INV of i×n stages (i=1, 2, . . . , and m). Those delay lines DL1 to DLm output sampling clocks CK1 to CKm. Each of those inverters INV has a same characteristic. In the A/D conversion device, the delay time in each of the delay lines DL1 to DLm is adjusted by the number of the inverters INV. It is thereby possible to provide the m-sampling clocks CK1 to CKm of a different phase ΔT with one another, namely whose phases are preciously shifted by ΔT with one another.

7 Claims, 10 Drawing Sheets

ANALOGUE TO DIGITAL CONVERSION DEVICE OPERABLE ON DIFFERENT SAMPLING CLOCKS

CROSS-REFERENCE TO RELATED APPLICATIONS

This application is related to and claims priority from Japanese Patent Application No. 2005-132209 filed on Apr. 28, 2005, the contents of which are hereby incorporated by reference.

BACKGROUND OF THE INVENTION

1. Field of the Invention

The present invention relates to an analog to digital (A/D) conversion device for converting an analog input signal into numerical data using a pulse delay circuit that has a plurality of delay units connected in series with one another, each of the delay units inputs, delays, and outputs a pulse signal.

2. Description of the Related Art

Figure 5A:
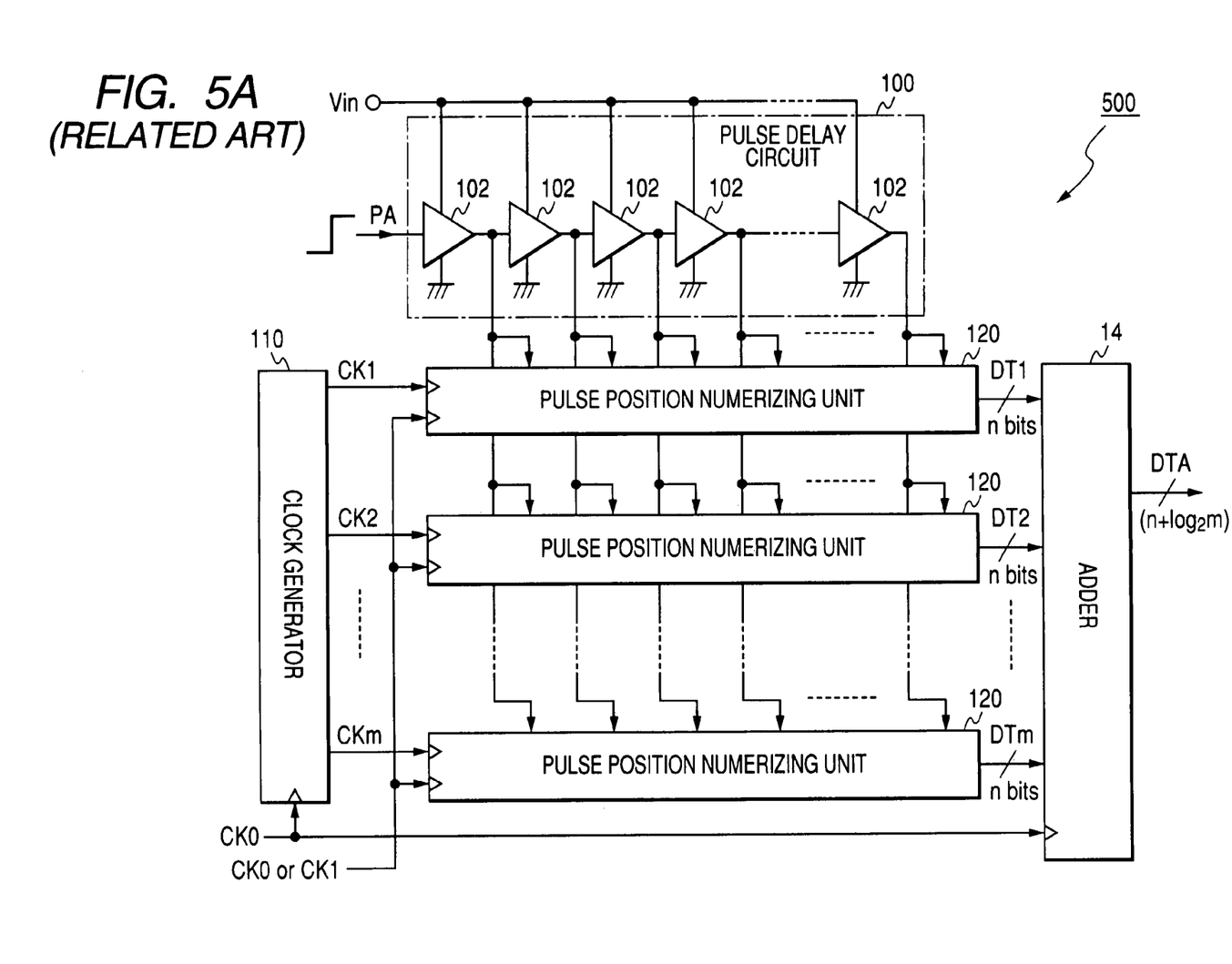
FIG. 5A is a block diagram showing a configuration of a conventional A/D conversion device.

As shown in FIG. 5A, a pulse delay type A/D conversion device 500 has been known, which has a pulse delay circuit 100, a clock generator 110, "m" pulse position numerizing units 120, and an adder 14. Such a pulse delay type A/D conversion device was disclosed in a Japanese patent laid open publication number JP 2004-7385, for example. In the conventional pulse delay type A/D conversion device 500, the pulse delay circuit 100 includes a plurality of delay units 102, each delay unit 102 inputting, delaying, and outputting a pulse signal, which are connected in series with one another. The clock generator 110 generates "m" sampling clocks CK1 to CKm, of different phases with one another. The "m" pulse position numerizing units 120 detects the number of the delay units 102 through which the pulse signal PA has passed through the pulse delay circuit 100 during one period that is determined based on both a reference clock CK0 and one of the sampling clocks CK1 to CKm generated by the clock generator 110. The "m" pulse position numerizing units 120 then outputs numerical data DT1 to DTm of n bits as the detection result. The adder 14 adds the "m" numerical data DT1 to DTm of n bits output from each of the "m" pulse position numerizing units 120, and then provides numerical data DAT of "n+$\log_2$ m bits".

In the A/D conversion device 500, each delay unit 102 forming the pulse delay circuit 100 is composed of a gate circuit such as an inverter, and an analogue input signal (voltage) Vin that becomes as a target for a A/D conversion to be processed is provided to each delay unit 102. The delay time of each delay unit 102 is changed according to the signal level (voltage level) of the analogue input signal Vin and is decreased according to the increasing of the analogue input signal Vin.

When the pulse signal PA is input to and transferred through the pulse delay circuit 100, the numerical data DT1 to DTm generated in synchronization with the analogue clock CK1 to CKm in each pulse position numerizing unit 120 is changed according to the signal level of the analogue input signal Vin. The signal level of the analogue input signal Vin is increased according to the increase of the numerical data DT1 to DTm. That is, each pulse position numerizing unit 120 performs the A/D conversion of the analogue input signal Vin, generates, and outputs the numerical data.

Figure 6:
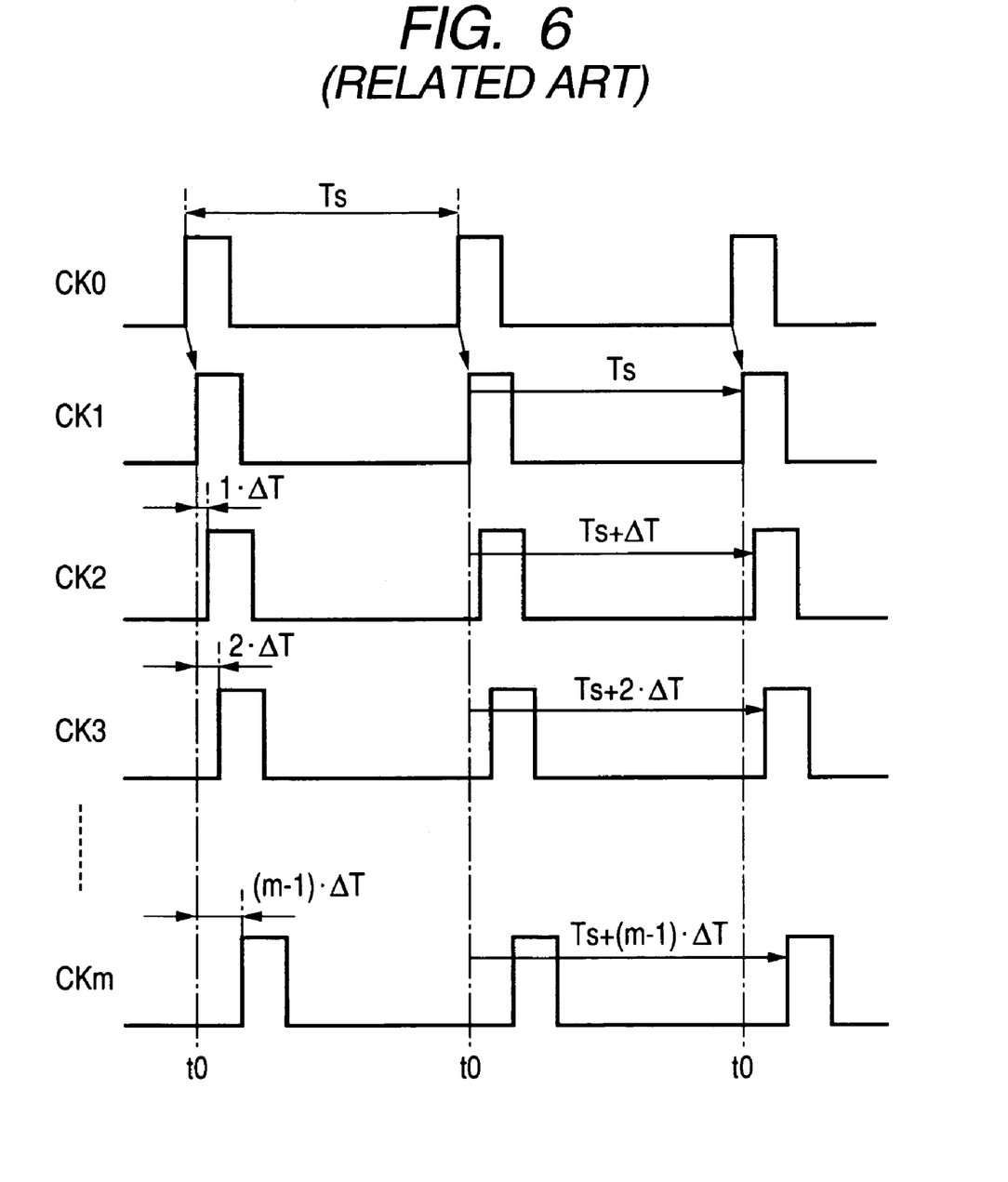
FIG. 6 is a timing chart showing the operation of the conventional A/D conversion device shown in FIG. 5A.

As shown in FIG. 6, a period of the reference clock CK0 is set to a constant time length Ts that is adequately longer than the delay time of each delay unit 102 (for example, more than several ten times of the delay time of each delay unit 102). The number of the stages for the delay units 102 in the pulse delay circuit 100 is set to the number that is adequately longer than the period Ts of the reference clock CK0 so that each pulse position numerizing unit 120 can perform the numerizing process more than a given times in synchronization with the reference clock CK0.

Each sampling clock CK1 to CKm is generated by delaying the reference clock CK0 and the phase of each sampling clock CK1 to CKm is delayed by unit time $\Delta T$ (=Td/m) which is obtained by dividing the delay time Td of the delay unit 102 forming the pulse delay circuit 100 by the number "m" of the sampling clocks CK1 to CKm. That is, each of the sampling clocks CK2 to CKm is delayed integral times of unit time $\Delta T$ such as $1 \times \Delta T$, $2 \times \Delta T$, $3 \times \Delta T$, ..., and $(m-1) \times \Delta T$ on the basis of the sampling clock CK1.

Each pulse position numerizing unit 120 performs the numerizing process of the number of the delay units 102 in the pulse delay circuit 100 through which the pulse signal PA passes during the sampling period (Ts+$\Delta T$, Ts+$2 \times \Delta T$, Ts+$3 \times \Delta T$, ..., and Ts+$(m-1) \times \Delta T$), and outputs the result of the numerizing to the adder 14. The sampling period (Ts+$\Delta T$, Ts+$2 \times \Delta T$, Ts+$3 \times \Delta T$, ..., and Ts+$(m-1) \times \Delta T$) is a time until a rising edge (or falling edge) of each sampling clock (CK1 to CKm) after the elapse of the period TS counted from a common initiation timing t0 for initiating the numerization process that is a rising edge (or a falling edge) of the sampling clock signal CK1.

Even if the voltage level of the analogue input signal Vin is a constant, a different sensitivity, namely a different voltage resolution of each pulse position numerizing unit 120 causes different output values DT1 to DTm from those units 120. This can perform the A/D conversion with a high preciously.

Figure 7A:
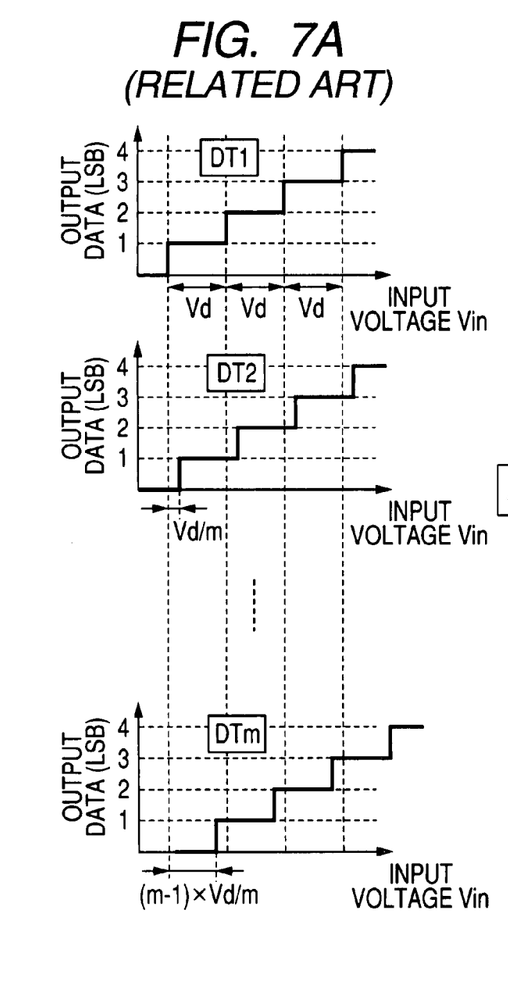
FIG. 7A and 7B are diagrams showing timing charts of a A/D conversion characteristic of the entire of the conventional A/D conversion device shown in FIG. 5A.

That is, the pulse position numerizing units 120 in the A/D conversion device 500 have different sampling times, and the adjacent those units 120 have the different sampling times that are shifted by unit time $\Delta T$ with one another. Each pulse position numerizing unit 120 performs the A/D conversion from the analogue input signal Vin to the numerical data DTi (i=1 to m) and as a result, provides the numerical data DTi that is shifted by Vd/m, where reference character Vd designates a voltage per LSB (Least Significant Bit) of the numerical data DTi, as shown in FIG. 7A.

Figure 7B:
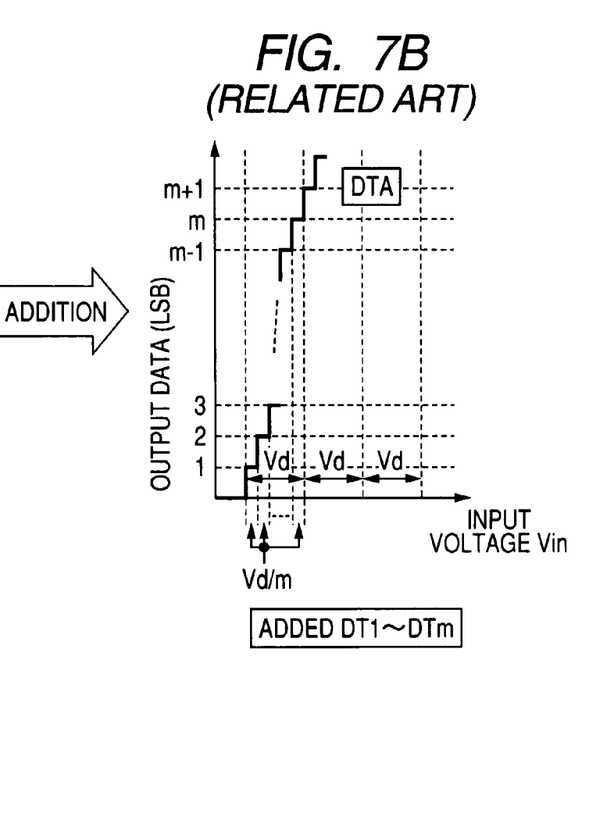

The adder 14 receives and adds those numerical data items DTi (i=1 to m) transferred from each of the pulse position numerizing units 120, and outputs numerical data DTA. As shown in FIG. 7B, the numerical data DTA, namely the output data DTA of the adder 14 has the characteristic to increase the level of the output data DTA by one LSB every increment Vd/m of the signal level of the analogue input signal Vin.

That is, the numerical data DTA obtained by adding the numerical data DT1 to DTm has a voltage resolution and a dynamic range of m-times when compared with those of the numerical data DTi before the addition. In other words, the voltage resolution is increased by the number of bits ($\log_2$m) increased by the addition, so that the A/D conversion for the analogue input signal Vin can be performed with a high precision.

Figure 5B:
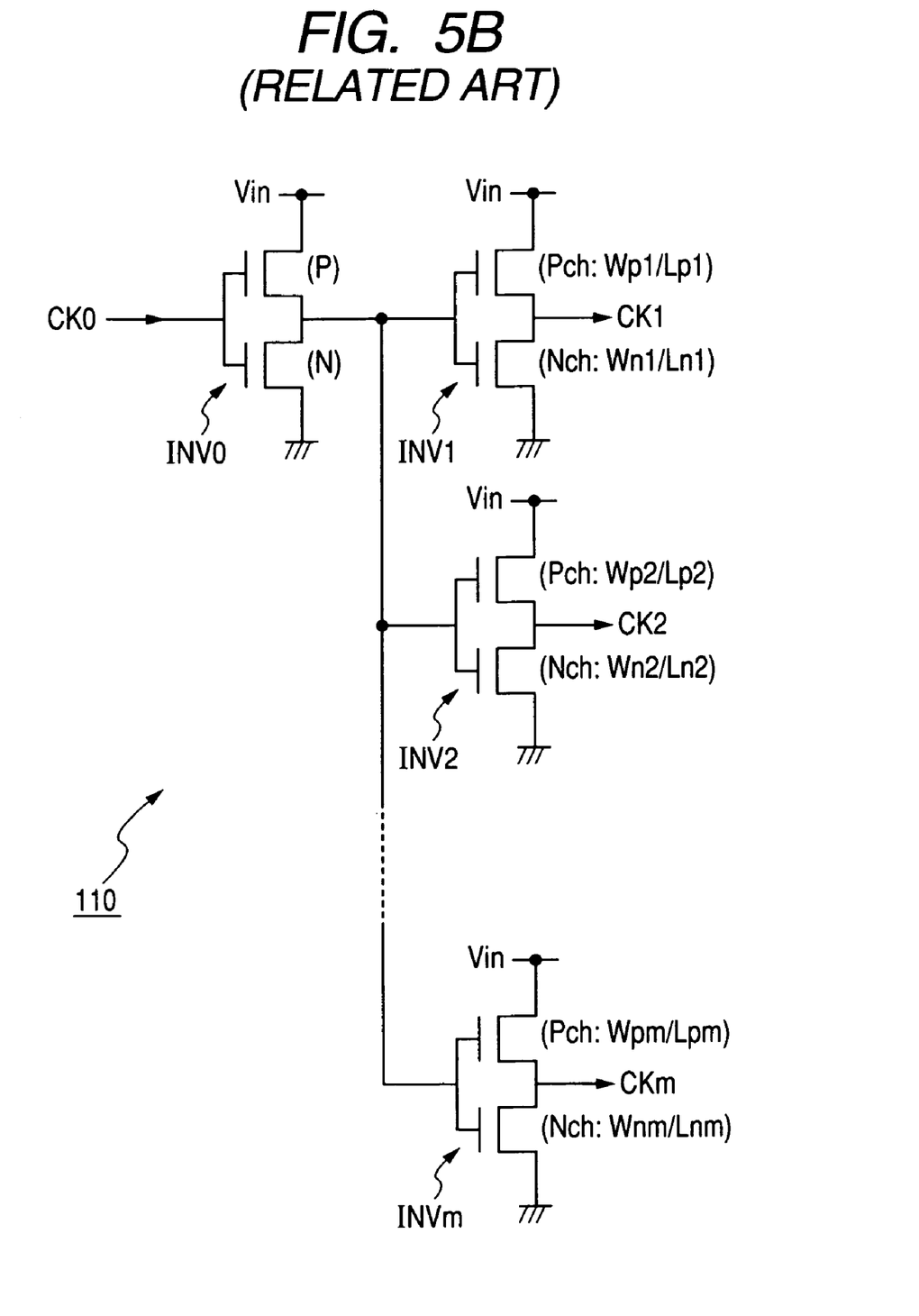
FIG. 5B is an explanatory diagram showing a configuration of a clock generator in the conventional A/D conversion circuit shown in FIG. 5A.

However, as shown in FIG. 5B, the A/D conversion device 500 disclosed by the Japanese patent laid open publication number JP 2004-7385 generates the m-sampling clocks CK1 to CKm by delaying the reference clock CK0 using the inverter INV0 of a preceding stage and the inverter INVm of a following stage. Further, in order to shift the phases of the sampling clocks CK1 to CKm by Td/m with one another, following parameters Lp, Ln, Wp, and Wn are adjusted:

Gate lengths Lp and Ln; and Transistor widths Wp and Wn, in a P channel transistor and a N channel transistor (such as FET: field effect transistor) forming each inverter INV1 to INVm of following stages.

That is, the delay time corresponding to the phase difference of the sampling clock CK1 to CKm is achieved by adjusting the level necessary for the inverting operation of an inverter that is obtained by adjusting the transistor size (determined by the above parameters) of those N and P channel transistors.

However, the above conventional manner of adjusting the amount of delay time of the clock generator 110, namely an analogue manner to adjust the delay time of each inverter INV1 to INVm by changing the transistor size forming the inverter INV1 to INVm causes a drawback or problem that it is difficult to form each transistor of a desired length and thereby difficult to shift the amount of the delay in each inverter INV1 to INVm by ΔT with a high precisely because in general etching error occurs during IC manufacturing. As a result, it becomes difficult to obtain the conversion characteristic of converting an analogue input signal Vin to numerical data DT1 to DTm in each pulse position numerizing unit 120 with a precisely shifted Vd/m and it further occurs variation of the magnitude of one LSB in the numerical data DTA obtained by adding the numerical data DT1 to DTm. This also causes the drawback that it is difficult to obtain highly precise numerical data from the A/D conversion device.

SUMMARY OF THE INVENTION

It is an object of the present invention to provide an A/D conversion device having an improved voltage resolution capable of outputting a highly precise A/D conversion data by setting a uniform size of a LSB (Least Significant Bit) of the numerical data after the completion of addition of plural numerical data items (as the result of the A/D conversion) that are obtained using sampling clocks of different phases with one another.

To achieve the above purpose, the present invention provides an analogue-to-digital (A/D) conversion device has a pulse delay circuit, a clock generator, m-pulse position numerizing units, and an adder. The pulse delay circuit has a plurality of delay units connected in series. Each delay unit is configured to input an analogue input signal and to delay the analogue input signal by a delay time corresponding to a voltage level of the analogue input signal. Each delay unit has inverting circuits of m×n stages (m, n are positive integers). The clock generator is configured to generate m-sampling clocks of a different phase by Td/m with one another, where Td is a delay time of each delay unit and m is an integer of not less than two. The clock generator has m-delay lines having inverting circuits of i×n stages (i=1, 2, . . . , and m) configured to output the m-sampling clocks. Each of the m-pulse position numerizing units is configured to detect a position of the pulse signal in the pulse delay circuit at a timing of one of a rising edge and a falling edge of the sampling clocks generated by the clock generator. Each of the m-pulse position numerizing units is configured to numerically express the detected position of the pulse signal and to output numerical data expressing the detected position. The adder is configured to add the numerical data output from all of the m-pulse position numerizing units and to output the added data as numerical data expressing the analogue input signal.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Hereinafter, various embodiments of the present invention will be described with reference to the accompanying drawings. In the following description of the various embodiments, like reference characters or numerals designate like or equivalent component parts throughout the several views.

EMBODIMENT

Figure 1A:
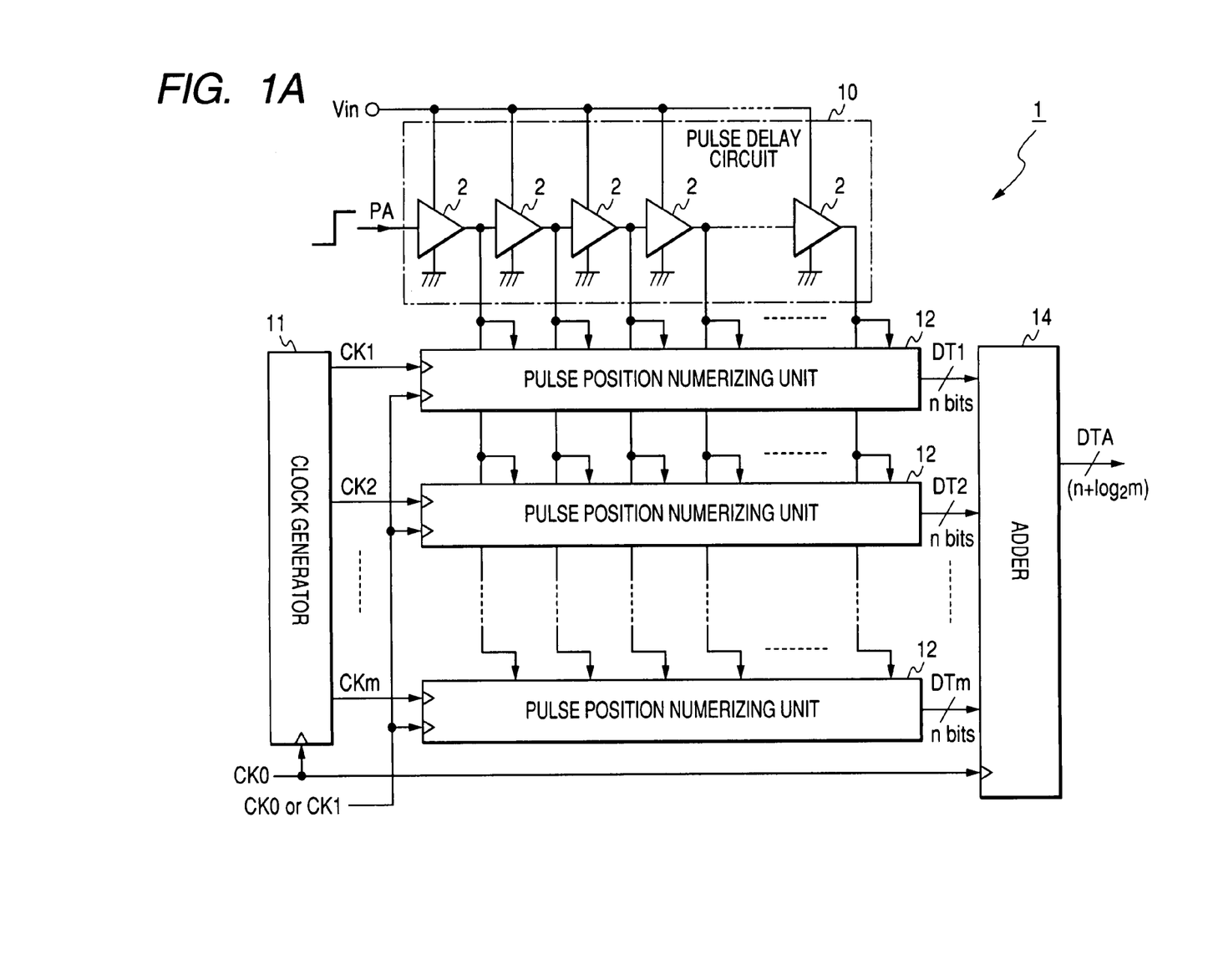
FIG. 1A is a block diagram showing a configuration of an A/D conversion device according to an embodiment of the present invention.
Figure 1B:
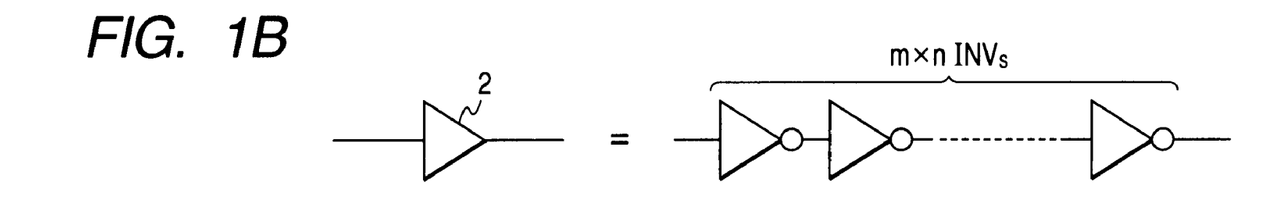
FIG. 1B is an explanatory diagram showing a configuration of a pulse delay circuit incorporated in the A/D conversion circuit shown in FIG. 1A.
Figure 1C:
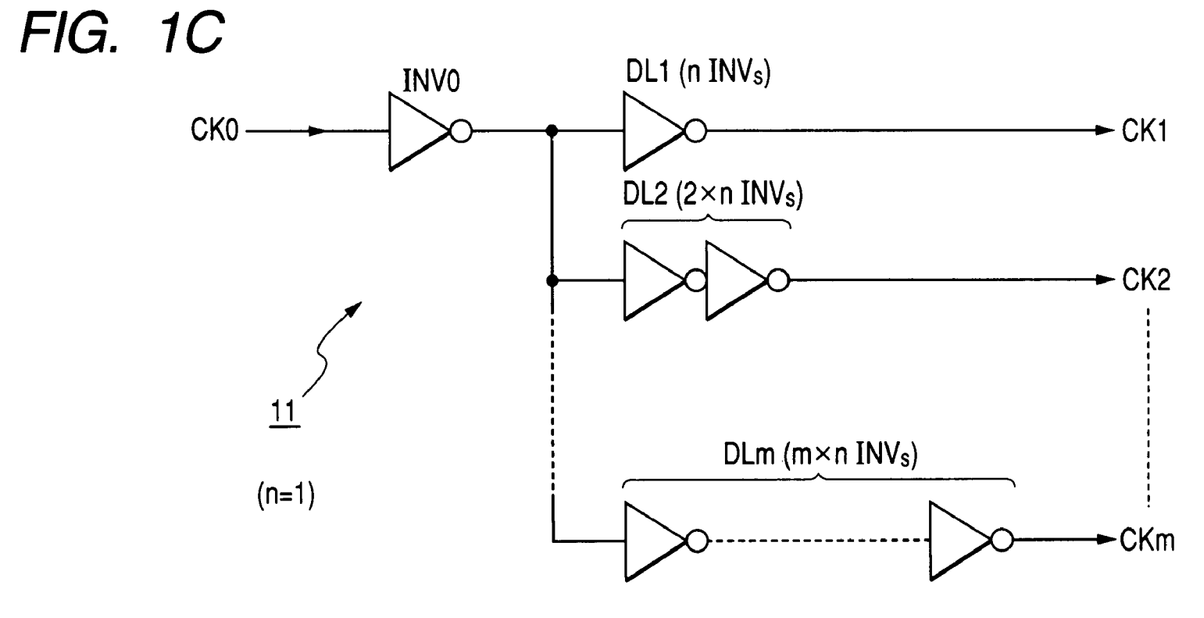
FIG. 1C is an explanatory diagram showing a configuration of a clock generator incorporated in the A/D conversion circuit shown in FIG. 1A.
Figure 2A:
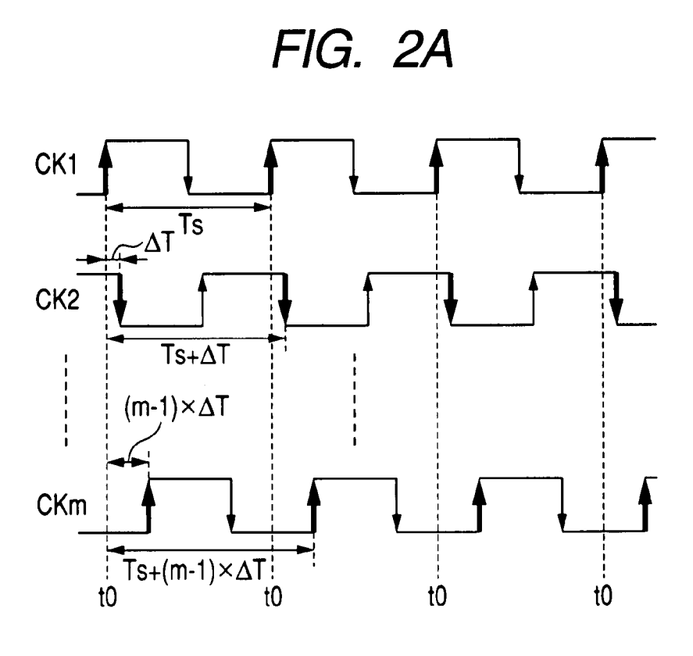
FIG. 2A and FIG. 2B are timing charts showing a sampling clock and a sampling time of each pulse position numerizing units incorporated in the A/D conversion circuit shown in FIG. 1A.
Figure 2B:
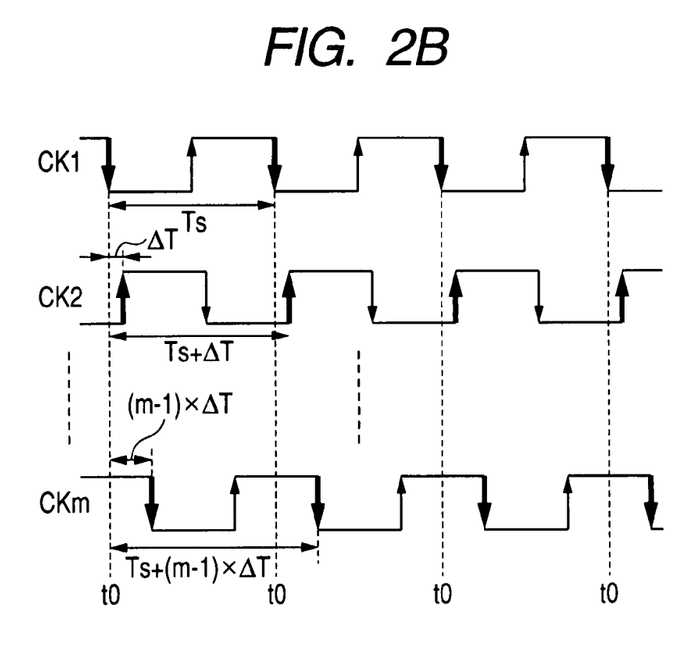

FIG. 1A is a block diagram showing a configuration of the A/D conversion device 1 according to an embodiment of the present invention. FIG. 1B is an explanatory diagram showing a configuration of the pulse delay circuit 10 incorporated in the A/D conversion circuit 1 shown in FIG. 1A, and FIG. 1C is an explanatory diagram showing a configuration of the clock generator 11 incorporated in the A/D conversion circuit 1 shown in FIG. 1A. Further, FIG. 2A and FIG. 2B are timing charts showing a sampling clock and a sampling time of each pulse position numerizing units 12 incorporated in the A/D conversion circuit 1 shown in FIG. 1A;

As shown in FIG. 1A, the A/D conversion device 1 of the embodiment has a pulse delay circuit 10, a clock generator 11, "m" pulse position numerizing units 12, and an adder 14. In the A/D conversion device 1, the pulse delay circuit 10 has $2^n$ delay units 2. As shown in FIG. 1B, each delay unit 2 has m×n inverters INV (as inverting circuits, n=1 in the embodiment) of a same characteristic or capability, which are connected in series.

As shown in FIG. 1C, the clock generator 11 has an inverter INV0 and m-delay lines DL1 to DLm. A reference clock CK0 of a period Ts is input to the inverter INV0. The m-delay lines DL1 to DLm input the output signal of the inverter INV0, and outputs m-delayed sampling clocks CK1 to CKm that are obtained by delaying the output of the inverter INV0 by a corresponding given delay time, respectively.

Each delay line DLi (i=1 to m) is composed of delay units of a given number connected in series, each delay unit in each delay line has the same characteristic of the delay unit 2 forming the pulse delay circuit 2.

As shown in FIG. 2A and FIG. 2B, the sampling clocks CK1 to CKm generated in the clock generator 11 having the above configuration have a different phase with one another, that are delayed by the unit time ΔT (=Td/m) with one another. The unit time ΔT (=Td/m) is obtained by dividing the delay time Td of the delay unit 2 by the number of the sampling clocks CK1 to CKm, namely by the number of the pulse position numerizing units 12. Because the variable "n" is 1 in the embodiment, the unit time ΔT becomes equal to the delay time Tp of the inverter INV.

Between the sampling clocks CKj and CKj+1 having a different phase of the unit time ΔT with one another, an interval between different edges such as between a rising edge and a falling edge or between a falling edge and a rising edge becomes the unit time ΔT. FIG. 2A shows the timing chart based on the rising edge of the sampling clock CK1, and FIG. 2B shows the timing chart based on the falling edge of the sampling clock CK1. Both FIG. 2A and FIG. 2B show the cases of odd number M.

Figure 3:
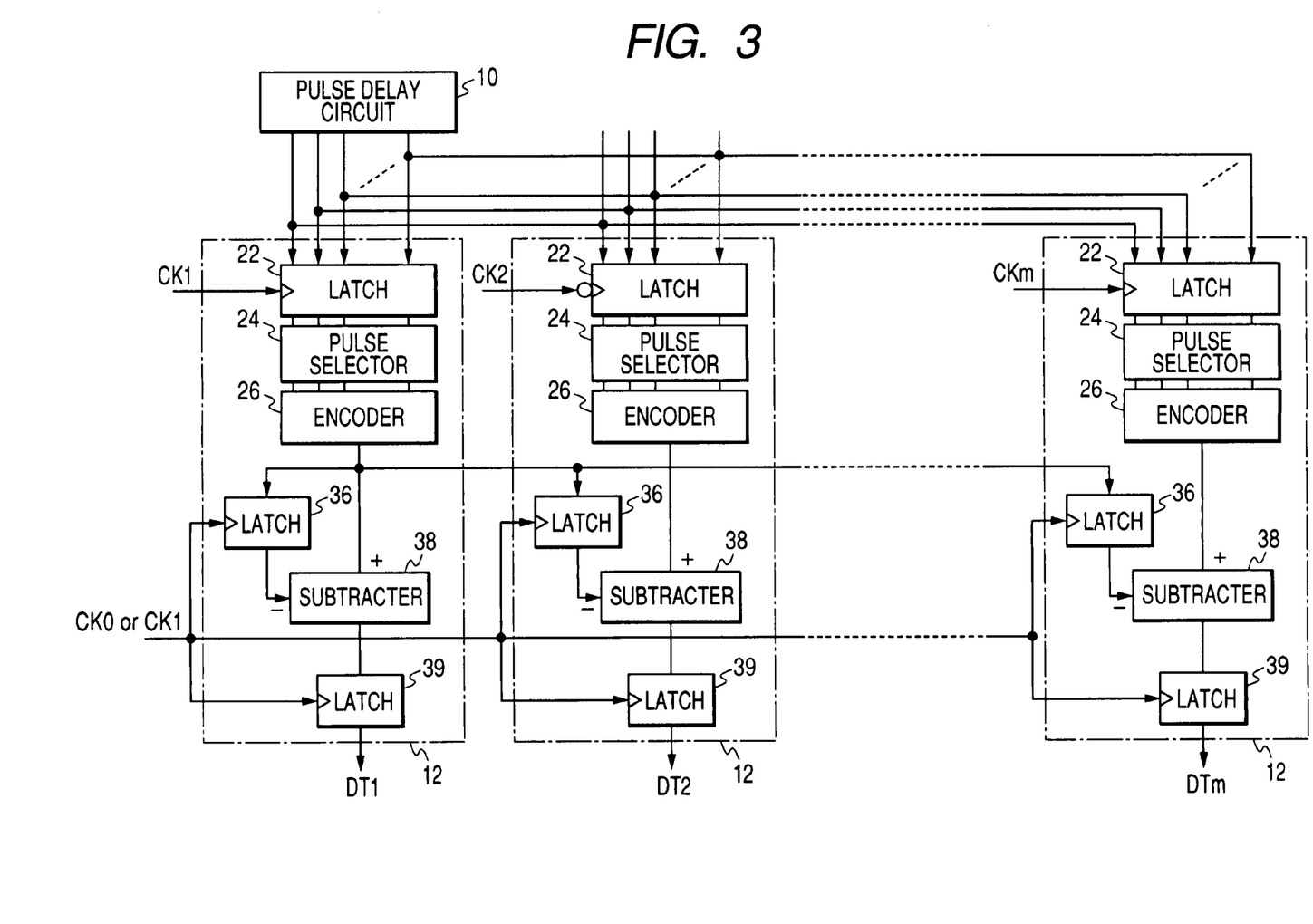
FIG. 3 is a block diagram showing a configuration of each pulse position numerizing unit incorporated in the A/D conversion device of the embodiment shown in FIG. 1A.

FIG. 3 is a block diagram showing a configuration of each pulse position numerizing unit 12 incorporated in the A/D conversion device 1 of the embodiment shown in FIG. 1A.

A description will now be given of the operation based on the rising edge of the sampling clock CK1. As shown in FIG. 3, each of the m-pulse position numerizing units 12 has a latch circuit 22, a pulse selector 24, an encoder 26, a latch circuit 36, a subtracter 38, and a latch circuit 39. The latch circuit 22 latches the output of each delay unit 2 in the pulse delay circuit 10 in synchronization with the timing of a predetermined edge of the corresponding sampling clock CKi. The predetermined edge is a rising edge when the variable "i" is an odd number, and a falling edge when it is an even number. The pulse selector 24 detects the position to change from a high level to a low level of the output of the delay unit 2 in the pulse delay circuit 10 based on the output of each delay unit 2 latched by the latch circuit 22. That is, the position when the output of the delay unit 2 is changed from the high level to the low level means the position to which the pulse signal has reached in the pulse delay circuit 10. The encoder 26 converts to n-bit numerical data the detection result (the position to which the pulse signal has reached in the pulse delay circuit 10) of the pulse selector 24. The latch circuit 26 latches the output of the encoder 26 in the pulse position numerizing unit 12 at the rising edge of the sampling clock CK1 (or the reference clock CK0). The encoder 26 in the pulse position numerizing unit 12 operates based on the sampling clock CK1 as operation clock. The subtracter 38 calculates a deviation between the numerical data output from the encoder 26 and the numerical data latched in the latch circuit 36. The latch circuit 39 latches the output from the subtracter 38 at the rising edge of the sampling clock CK1 (or the reference clock CK0) and then outputs the latched data as n-bit numerical data DT1 to DTm.

Figure 4A:
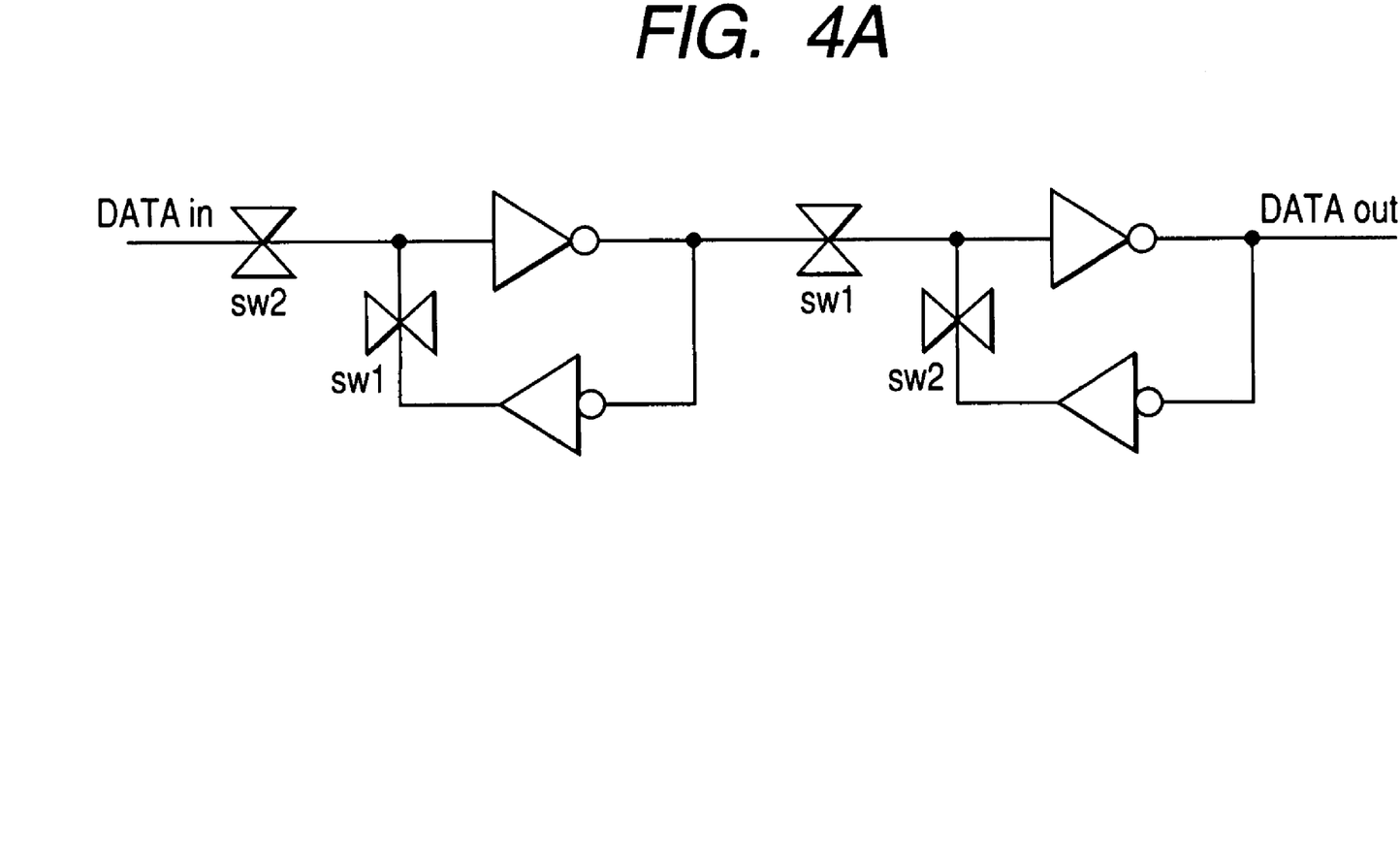
FIG. 4A is a circuit diagram showing a configuration of a master-slave latch circuit.

FIG. 4 is a circuit diagram showing a configuration of a master-slave latch circuit. The latch circuit 22, as shown in FIG. 4, is composed of four inverters and four analogue switches, as called usually to as the master-slave latch circuit and is configured to perform its operation as follows. When the latch circuit 22 latches data at the timing of a rising edge of the sampling clock CKi, a switch SW1 enters ON and a switch SW2 falls to OFF at the rising edge of the sampling clock CKi, and the switch falls to OFF and the switch enters ON at the falling edge thereof. On the contrary, when the latch circuit 22 latches data at the timing of the falling edge of the sampling clock CKi, the switch SW1 enters ON and the switch SW2 falls to OFF at the falling edge of the sampling clock CKi, and the switch falls to OFF and the switch enters ON at the rising edge thereof.

In the pulse position numerizing unit 12 having the above configuration, the latch circuit 22 latches the output from each delay unit 2 forming the pulse delay circuit 10 at the timing of a given edge of the sampling clock CKi. Further, the latch circuit 36 latches the numerical data at the rising edge of the sampling clock CK1 (or the reference clock CK0), in which the above numerical data latched by the latch circuit 36 are obtained through the pulse selector 24 and the encoder 26 that have been latched at the rising edge of the sampling clock CK1 of a preceding cycle.

As a result, as shown in FIG. 2B, the pulse position numerizing units 12 performs the numerically expressing operation for the number of the delay units 2 in the pulse delay circuit 10 through which the pulse signal PA has passed for the sampling time (Ts, Ts+ΔT, Ts+2×ΔT, Ts+3×ΔT, . . . , and Ts+m×ΔT) until the predetermined edge of each sampling clock CKi occurred at a timing after the elapse of the period Ts counted from the common timing t0, where t0 means the rising edge of the sampling clock CK1 as a common initiation timing for the numerically expressing operation. The pulse position numerizing units 12 outputs the numerical data DT1 to DTm obtained. The adder 14 then inputs those numerical data DT1 to DTm obtained by the above manner.

The adder 14 adds the numerical data DT1 to DTm to generate the numerical data DTA as the result of the A/D conversion and outputs the numerical data DTA to the outside of the A/D converter 1.

As described above in detail, the A/D conversion device 1 of the embodiment according to the present invention has the feature that the A/D conversion characteristic or capability of each pulse position numerizing unit 12 has the shifted phase Vd/m with one another. This feature can be achieved or realized by shifting the phase of the sampling clock CK1 to CKm, namely the sampling time in each pulse position numerizing unit 12 by the reference time ΔT in order to shift the A/D conversion characteristic or capability of each pulse position numerizing unit 12 by Vd/m with one another, where the reference time ΔT is obtained by dividing the delay time Td of the delay unit 2 by the number "m" of the pulse position numerizing unit 12.

Accordingly, the numerical data DTA, obtained by adding the numerical data item DT1 to DTm of each of the pulse position numerizing unit 12, has the voltage resolution and the dynamic range that are m-times of those of the numerical data DT1 to DTm before addition by the adder 14.

Thus, the A/D conversion device of the embodiment can perform the A/D conversion with a high precisely.

Further, in the A/D conversion device 1 of the embodiment, the delay unit 2 is made of m×n inverters INV (n=1 in this embodiment), and the clock generator 11 is made of the m-delay lines DL1 to DLm, each having i×n (i=1, 2, . . . , and m) inverters INV, and the outputs of the delay lines DL1 to DLm are used as the sampling clock CK1 to CKm, respectively.

On the contrary, the conventional A/D converter device shown in FIG. 5A must adjust the size of each transistor forming the inverter. It is hard to fabricate the transistors by precisely adjusting the size thereof and thereby difficult to satisfy this requirement.

On the other hand, the present invention does not require to adjust the size of each transistor forming the inverter INV, but adjusts the amount of the delay in each delay line DL1 to DLm by changing only the number of inverters INV, each of which has a same characteristic or capability, and thereby based on the changing of the phase difference of the sampling clock. Therefore the A/D converter device according to the present invention can generate and use the m-sampling clocks CK1 to CKm whose phases are shifted preciously by $\Delta T$ (Td=/m) with one another.

As a result, each pulse position numerizing unit 12 has the A/D conversion characteristic or capability to shifting data precisely by Vd/m, where Vd is a voltage per LSB of the numerical data output from the pulse position numerizing unit 12. Further, the total A/D conversion characteristic or capability of the A/D conversion device 1 can output the numerical data DTA obtained by adding the data DT1 to DTm and one LSB is precisely increased every voltage change Vd/m.

That is, according to the A/D conversion device 1 of the embodiment, the numerical data DAT with a high resolution, obtained by adding the numerical data DT1 to DTm output from the plural pulse position numerizing units 12, have the LSB of a same magnitude or size, so that it is possible to realize and perform the A/D conversion with a high preciseness.

The relationship between the elements of the A/D conversion device according to the embodiment and means defined in claims is as follows.

The m-pulse position numerizing units 12 correspond to m-pulse position numerizing means, the adder 14 corresponds an addition means, and the latch circuit 22 corresponding to a hold circuit.

In the explanation of the embodiment describe above, the pulse delay circuit 10 is composed of the plural delay units 2 connected in series in the embodiment. However, the present invention is not limited by this example.

Figure 4B:
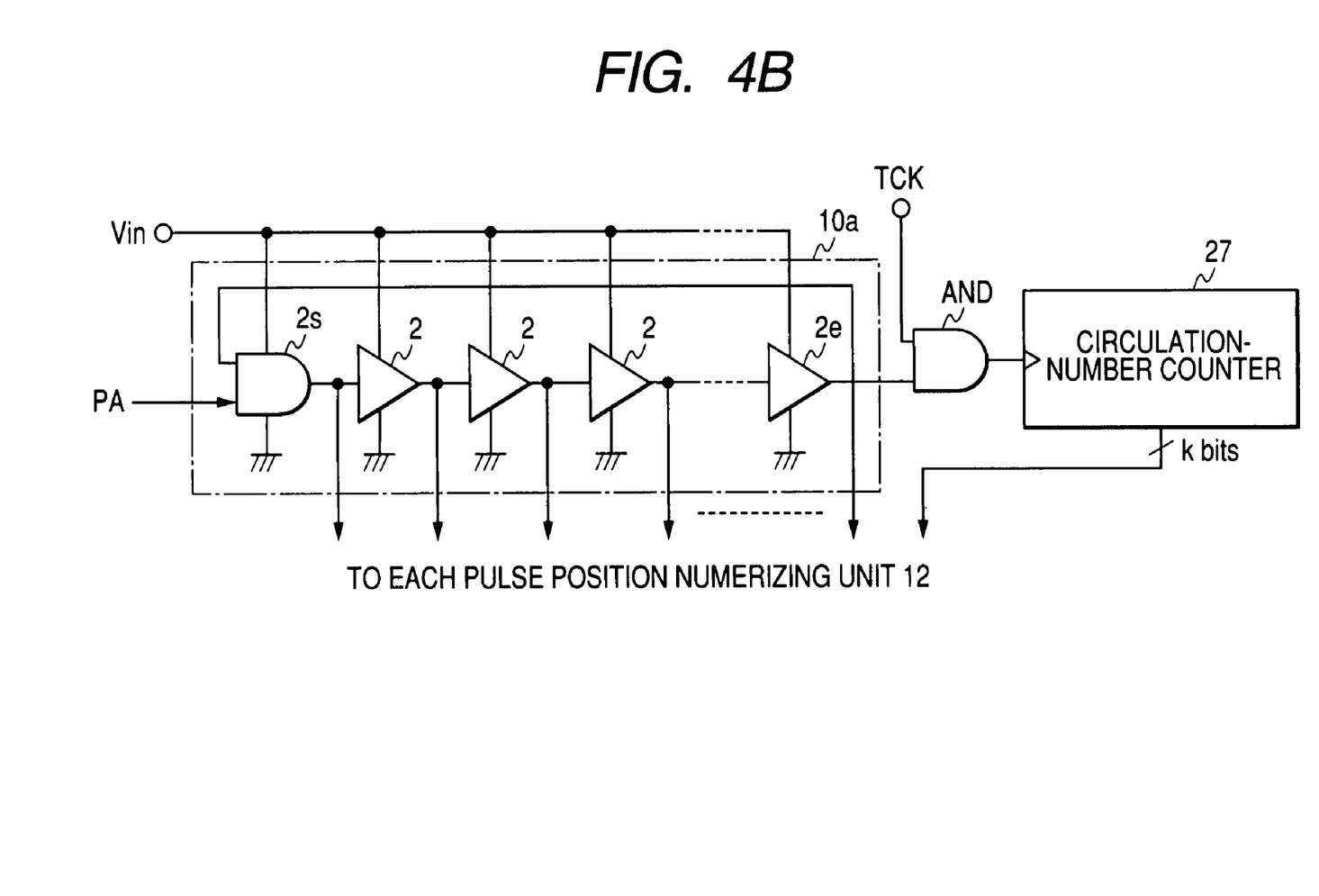
FIG. 4B is a block diagram showing another configuration of the pulse delay circuit incorporated in the A/D conversion device according to the embodiment of the present invention.

FIG. 4B is a block diagram showing another configuration of the pulse delay circuit in the A/D conversion device according to the embodiment. For example, as shown in FIG. 4B, it is possible to form the pulse delay circuit 10a by using a ring delay line (RDL) in which plural delay units 2s, 2, . . . , and 2e are connected in series and the delay unit 2s of the initial stage is connected to the delay unit 2e of the final stage in order to form the circulation signal line. The ring delay line (RDL) needs to include a circulation-number counter 27 for counting the number of circulation of the signal through the ring delay line of a ring connection. Further, it is acceptable that each pulse position numerizing unit 12 receives the output of the circulation-number counter 27 as upper bit data items.

In this case, it is possible to reduce the number of stages forming the pulse delay circuit 10a by half every increment of the circulation-number counter 27 by one bit when the number of bits of numerical data DT1 to DTm is set constant. This can reduce the circuit size greatly and provide the A/D conversion device with a small size.

Still further, in the description of the embodiment described above, the parameter "n" of "m×n" is set to one (n=1), where "n" is the number of the inverters INV forming the pulse delay circuit and the delay lines DL1 to DLm. However, the present invention is not limited by this example. For example, it is possible to set the parameter "n" to two or more. In particular, setting the parameter "n" to an even number can simplify the configuration of those pulse delay circuit and the delay lines DL1 to DLm because the components and units operate only at the rising edge or at the falling edge of the sampling clock CKi.

Features and Effects According to the Present Invention

As described above in detail, according to the present invention, the analogue-to-digital (A/D) conversion device has the pulse delay circuit that is composed of the plural delay units connected in series, each delay unit inputs the analogue input signal and then delays it by a delay time corresponding to a voltage level of the analogue input signal. The clock generator generates the m-sampling clocks of a different phase by Td/m with one another, where Td is a delay time of each delay unit and m is an integer of not less than two.

Each of the m-pulse position numerizing means detects the position of the pulse signal in the pulse delay circuit at the rising edge or falling edge of the corresponding sampling clocks in the m-sampling clocks generated by the clock generator, and then performs the numerical expressing for the detected position of the pulse signal. The adder adds the numerical data from each pulse position numerizing means and outputs the result of the addition as numerical data expressing the analogue input signal.

The delay unit is composed of the m×n (m, n are positive integers) inverting circuits. The clock generator is composed of the m-delay lines composed of the inverters of i×n (i=1, 2, . . . , and m) stages. The sampling clocks are output from the m-delay lines. If one inverter circuit has a delay time Tp, the total delay time of the pulse delay circuit becomes m×n×Tp. Further, the unit time is $\Delta T = Td/m$, the delay time of the delay line forming the clock generator becomes $\Delta T$ (=n×Tp), 2×$\Delta T$ (=2×n×Tp), . . . , and m$\Delta T$ (=m×n×Tp), respectively.

That is, the present invention does not adjust the size of each transistor forming the inverter, but adjusts the amount of the delay of each delay line by changing only the number of inverting circuits, each of which has a same characteristic or capability and the present invention thereby changes the phase difference of the sampling clock. Therefore the A/D converter device according to the present invention can generate and use the m-sampling clocks whose phases are shifted preciously by $\Delta T$ (Td=/m) with one another.

As a result, each pulse position numerizing means has the A/D conversion characteristic or capability to shifting data precisely by Vd/m, where Vd is a voltage per LSB of the numerical data output from the pulse position numerizing means. Further, the total A/D conversion characteristic or capability of the A/D conversion device can output the numerical data DTA is precisely increased every voltage change Vd/m.

That is, according to the A/D conversion device 1 of the present invention, the numerical data DAT with a high resolution obtained by adding the numerical data DT1 to DTm output from the plural pulse position numerizing units 12 have the LSB of a same magnitude or size, so that it is possible to realize and perform the A/D conversion with a high preciseness.

According to the A/D conversion device of the present invention, the numerical data DAT with a high resolution obtained by adding the numerical data output from the plural pulse position numerizing means have the LSB of a same magnitude or size, so that it is possible to realize and perform the A/D conversion with a high preciseness.

Still further, according to the present invention, it is possible to increase the precision of the voltage resolution under various applications because increasing the number of numerical data items to be added can increase the precision without using Dither effect during the addition process.

Still further, according to the present invention, it is possible to obtain a desired or optimum voltage resolution and dynamic range by setting the number of stages of the pulse position numerizing means to an optional value.

The A/D conversion device according to the present invention is more effectively applied to various applications that need to form delay units by plural inverting circuits with a reduced delay time achieved by the progress of microelectronic fabrication process. It is also possible to increase the voltage resolution of the A/D conversion device without increasing the number of delay units.

Still further, in the A/D conversion device according to the present invention, it is preferred that the inverting circuits, forming the delay units and the clock generator, operate based on an analogue input signal as a driving voltage. In this case, because the delay time of the inverting circuit forming the clock generator is changed even if the delay time (Tp) of the inverting circuit and further the delay time (Td) of the entire of the delay unit are changed by variation of the voltage level of the analogue input signal, the amount of the delay time of each delay line becomes positive-integer times of the unit time $\Delta T$ (Td/m), in which Td is the delay time of the delay unit. It is therefore possible to certainly prevent occurrence of variation in the magnitude of LSB.

Usually, the pulse position numerizing means is equipped with a hold circuit for holding the output from each delay unit forming the pulse delay circuit in synchronization with the sampling clock. When the parameter "n" determining the number of the inverting circuits forming the delay unit is an odd number, the sampling clock whose phase is shifted by the unit time $\Delta T$ (=Td/m) takes the time interval $\Delta T$ between different edges such as between a rising edge and a falling edge or between a falling edge and a rising edge of the sampling clock. Accordingly, in order to execute the m-pulse position numerizing means (in particular, the hold circuit incorporated in each of such means) by shifting $\Delta T$ with one another using the m-sampling clocks having the above feature or relationship, it is necessary to use or incorporate both types of the inverting circuits, one operates at the rising edge and the other operate at the falling edge of the sampling clock.

Still further, when the parameter "n" determining the number of the inverting circuits forming the delay unit is an even number, the sampling clock whose phase is shifted by the unit time $\Delta T$ (=Td/m) takes the time interval $\Delta T$ between same edges such as between a rising edge and a following rising edge or between a falling edge and a following falling edge of the sampling clock. In order to execute the m-pulse position numerizing means (in particular, the hold circuit incorporated in each of such means) by shifting $\Delta T$ with one another using the m-sampling clocks having the above feature or relationship, it is necessary to use or incorporate the same type of the inverting circuits, both operate at the rising edge or at the falling edge of the sampling clock.

It is possible to use a master-slave latch circuit as the hold circuit, the master-slave latch circuit operates based on both timings, namely at the rising edge and at the falling edge of the sampling clock.

Still furthermore, it is acceptable to use a ring delay line as the pulse delay circuit, in which the delay units are connected in a ring shape to form the pulse delay circuit and further to add the circulation counter for counting the number of circulations of the pulse input signal through the ring delay line. In this configuration, the pulse position numerizing means detects the position of the pulse signal in the pulse delay circuit and the count value of the circulation counter, and generates numerical data, the lower data of which are numerical data of the position of the pulse signal and the upper data of which are the detected count value.

It is thereby possible to reduce greatly the circuit size of the A/D conversion device because the number of the stages of the delay units forming the pulse delay circuit can be reduced by half (½) per increasing one bit of the circulation counter when the number of bits of the numerical data is set to a constant value.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalent thereof.

What is claimed is:

1. An analogue-to-digital (A/D) conversion device comprising:
   a pulse delay circuit comprising a plurality of delay units connected in series, each delay unit configured to input an analogue input signal and to delay the analogue input signal by a delay time corresponding to a voltage level of the analogue input signal, and each delay unit comprising inverting circuits of m×n (m, n are positive integers) stage;
   a clock generator configured to generate m-sampling clocks of a different phase by Td/m with one another, where Td is a delay time of each delay unit and m is a positive integer of not less than two, and the clock generator comprising m-delay lines comprising inverting circuits of i×n stages (i=1, 2, . . . , and m) configured to output the m-sampling clocks;
   m-pulse position numerizing means each configured to detect a position of a pulse signal output from the pulse delay circuit at a timing of one of a rising edge and a falling edge of a corresponding one of the m-sampling clocks generated by the clock generator, and the m-pulse position numerizing means configured to numerically express the detected position of the pulse signal and to output numerical data expressing the detected position of the pulse signal;
   an adder configured to add the numerical data output from the m-pulse position numerizing means and to output the added data as numerical data expressing the analogue input signal, wherein
   each of the m-pulse position numerizing means comprises at least a hold circuit configured to hold an output from a corresponding one of the plurality of delay units forming the pulse delay circuit, in synchronization with the corresponding one of the m-sampling clocks, and the parameter "n" determining a number of the inverting circuits in each of the plurality of delay units is an odd number, and the hold circuit forming each of the m-pulse position numerizing means is composed of both an inverter operating at the rising edge of the corresponding sampling clock and an inverter operating at the falling edge of the corresponding sampling clock.

2. The A/D conversion device according to claim 1, wherein the hold circuit is made of a master-slave latch circuit configured to be operable at both timings of the rising edge and the falling edge of the corresponding one of the m-sampling clocks.

3. The A/D conversion device according to claim 1, wherein
the pulse delay circuit comprises a ring delay line in which the delay units are connected in a ring shape,
the A/D conversion device further comprises a circulation-number counter for counting the number of circulations of the pulse signal through the ring delay line,
each of the m-pulse position numerizing means is configured to detect the position of the pulse signal in the pulse delay circuit and to detect the number counted by the circulation-number counter at one of the timings of the rising edge and the falling edge of the corresponding one of the m-sampling clocks, and configured to generate numerical data composed of lower data and upper data, the lower data being the numerized data of the detected position of the pulse signal, and the upper data being numerized detected count number.

4. An analogue-to-digital (A/D) conversion device comprising:
a pulse delay circuit comprising a plurality of delay units connected in series, each delay unit configured to input an analogue input signal and to delay the analogue input signal by a delay time corresponding to a voltage level of the analogue input signal, and each delay unit comprising inverting circuits of m×n (m, n are positive integers) stage;
a clock generator configured to generate m-sampling clocks of a different phase by Td/m with one another, where Td is a delay time of each delay unit and m is a positive integer of not less than two, and the clock generator comprising m-delay lines comprising inverting circuits of i×n stages (i=1, 2, ..., and m) configured to output the m-sampling clocks;
m-pulse position numerizing means each configured to detect a position of a pulse signal output from the pulse delay circuit at a timing of one of a rising edge and a falling edge of a corresponding one of the m-sampling clocks generated by the clock generator, and the m-pulse position numerizing means configured to numerically express the detected position of the pulse signal and to output numerical data expressing the detected position of the pulse signal;
an adder configured to add the numerical data output from the m-pulse position numerizing means and to output the added data as numerical data expressing the analogue input signal, wherein
the inverting circuits forming the delay units and the clock generator operate based on the analogue input signal as a driving voltage,
each of the m-pulse position numerizing means comprising at least a hold circuit configured to hold an output from a corresponding one of the plurality of delay units forming the pulse delay circuit, in synchronization with the corresponding one of the m-sampling clocks, and the parameter "n" determining a number of the inverting circuits in each of the plurality of delay units is an odd number, and the hold circuit forming each of the m-pulse position numerizing means is composed of both an inverter operating at the rising edge of the corresponding sampling clock and an inverter operating at the falling edge of the corresponding sampling clock.

5. An analogue-to-digital (A/D) conversion device comprising:
a pulse delay circuit comprising a plurality of delay units connected in series, each delay unit configured to input an analogue input signal and to delay the analogue input signal by a delay time corresponding to a voltage level of the analogue input signal, and each delay unit comprising inverting circuits of m×n (m, n are positive integers) stage;
a clock generator configured to generate m-sampling clocks of a different phase by Td/m with one another, where Td is a delay time of each delay unit and m is a positive integer of not less than two, and the clock generator comprising m-delay lines comprising inverting circuits of i×n stages (i=1, 2, ..., and m) configured to output the m-sampling clocks;
m-pulse position numerizing means each configured to detect a position of a pulse signal output from the pulse delay circuit at a timing of one of a rising edge and a falling edge of a corresponding one of the m-sampling clocks generated by the clock generator, and the m-pulse position numerizing means configured to numerically express the detected position of the pulse signal and to output numerical data expressing the detected position of the pulse signal;
an adder configured to add the numerical data output from the m-pulse position numerizing means and to output the added data as numerical data expressing the analogue input signal, wherein
each of the m-pulse position numerizing means comprises at least a hold circuit configured to hold an output from a corresponding one of the plurality of delay units forming the pulse delay circuit, in synchronization with the corresponding one of the m-sampling clocks, and
the hold circuit is made of a master-slave latch circuit configured to be operable at both timings of the rising edge and the falling edge of the corresponding one of the m-sampling clocks.

6. An analogue-to-digital (A/D) conversion device comprising:
a pulse delay circuit comprising a plurality of delay units connected in series, each delay unit configured to input an analogue input signal and to delay the analogue input signal by a delay time corresponding to a voltage level of the analogue input signal, and each delay unit comprising inverting circuits of m×n (m, n are positive integers) stage;
a clock generator configured to generate m-sampling clocks of a different phase by Td/m with one another, where Td is a delay time of each delay unit and m is a positive integer of not less than two, and the clock generator comprising m-delay lines comprising inverting circuits of i×n stages (i=1, 2, ..., and m) configured to output the m-sampling clocks;
m-pulse position numerizing means each configured to detect a position of a pulse signal output from the pulse delay circuit at a timing of one of a rising edge and a falling edge of a corresponding one of the m-sampling clocks generated by the clock generator, and the m-pulse position numerizing means configured to numerically express the detected position of the pulse signal and to output numerical data expressing the detected position of the pulse signal;

an adder configured to add the numerical data output from the m-pulse position numerizing means and to output the added data as numerical data expressing the analogue input signal, wherein each of the m-pulse position numerizing means comprises at least a hold circuit configured to hold an output from a corresponding one of the plurality of delay units forming the pulse delay circuit, in synchronization with the corresponding one of the m-sampling clocks, and the hold circuit is made of a master-slave latch circuit configured to be operable at both timings of the rising edge and a falling edge of the corresponding one of the m-sampling clocks.

7. An analogue-to-digital (A/D) conversion device comprising:

a pulse delay circuit comprising a plurality of delay units connected in series, each delay unit configured to input an analogue input signal and to delay the analogue input signal by a delay time corresponding to a voltage level of the analogue input signal, and each delay unit comprising inverting circuits of m×n (m, n are positive integers) stage;

a clock generator configured to generate m-sampling clocks of a different phase by Td/m with one another, where Td is a delay time of each delay unit and m is a positive integer of not less than two, and the clock generator comprising m-delay lines comprising inverting circuits of i×n stages (i=1, 2, . . . , and m) configured to output the m-sampling clocks;

m-pulse position numerizing means each configured to detect a position of a pulse signal output from the pulse delay circuit at a timing of one of a rising edge and a falling edge of a corresponding one of the m-sampling clocks generated by the clock generator, and the m-pulse position numerizing means configured to numerically express the detected position of the pulse signal and to output numerical data expressing the detected position of the pulse signal;

an adder configured to add the numerical data output from the m-pulse position numerizing means and to output the added data as numerical data expressing the analogue input signal, wherein each of the m-pulse position numerizing means comprises at least a hold circuit configured to hold an output from a corresponding one of the plurality of delay units forming the pulse delay circuit, in synchronization with the corresponding one of the m-sampling clocks, and the hold circuit is made of a master-slave latch circuit configured to be operable at both timings of the rising edge and the falling edge of the corresponding one of the m-sampling clocks.

* * * * *